US010388542B2

(12) United States Patent
Saeki

(10) Patent No.: US 10,388,542 B2
(45) Date of Patent: Aug. 20, 2019

(54) RESIST REMOVING APPARATUS AND METHOD FOR REMOVING RESIST

(71) Applicant: Mitsubishi Electric Corporation, Tokyo (JP)

(72) Inventor: Hisayuki Saeki, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/895,164

(22) Filed: Feb. 13, 2018

(65) Prior Publication Data

US 2018/0174867 A1 Jun. 21, 2018

Related U.S. Application Data

(62) Division of application No. 14/614,990, filed on Feb. 5, 2015, now abandoned.

(30) Foreign Application Priority Data

May 26, 2014 (JP) .................................. 2014-107763

(51) Int. Cl.
H01L 21/67 (2006.01)
H01L 21/02 (2006.01)

(52) U.S. Cl.
CPC .. *H01L 21/67023* (2013.01); *H01L 21/02057* (2013.01); *H01L 21/6708* (2013.01)

(58) Field of Classification Search
None
See application file for complete search history.

(56) References Cited

U.S. PATENT DOCUMENTS 4,439,338 A 3/1984 Tomaiuolo et al.
7,004,181 B2 2/2006 Isago et al.
(Continued)

FOREIGN PATENT DOCUMENTS

CN 103681238 A 3/2014
DE 90 13 668 U1 3/1992
(Continued)

OTHER PUBLICATIONS

An Office Action; "Notice of Reasons for Rejection," issued by the Japanese Patent Office dated Mar. 7, 2017, which corresponds to Japanese Patent Application No. 2014-107763; and is related to the present application; with English language Concise Explanation.
(Continued)

*Primary Examiner* — Eric W Golightly
*Assistant Examiner* — Arlyn I Rivera-Cordero
(74) *Attorney, Agent, or Firm* — Studebaker & Brackett PC

(57) ABSTRACT

A nozzle as a whole is formed into a cylindrical structure having a supply surface with a supply opening as a bottom surface, and the supply surface is narrower than a surface of a wafer main portion of a sectional recession wafer and has a shape that fits in the surface of the wafer main portion. Therefore, in a state where the center of the wafer main portion and the center of the supply surface coincide with each other in plan view, the nozzle is brought close to the surface of the wafer main portion of the sectional recession wafer, whereby the supply surface of the nozzle can be disposed in a close distance from the surface of the wafer main portion in a wafer inner space.

1 Claim, 1 Drawing Sheet

(56) References Cited

U.S. PATENT DOCUMENTS

| | | | |
|---|---|---|---|
| 7,288,156 | B2 | 10/2007 | Isago et al. |
| 8,945,988 | B2 | 2/2015 | Numaguchi |
| 9,564,401 | B2 | 2/2017 | Numaguchi |
| 2003/0041881 | A1 | 3/2003 | Isago et al. |
| 2003/0196683 | A1 | 10/2003 | Izumi et al. |
| 2004/0065540 | A1 | 4/2004 | Mayer et al. |
| 2006/0112974 | A1 | 6/2006 | Isago et al. |
| 2012/0073609 | A1 | 3/2012 | Hashimoto et al. |
| 2012/0216828 | A1 * | 8/2012 | Tanaka .................. B08B 3/022 134/1 |
| 2014/0070374 | A1 | 3/2014 | Numaguchi |
| 2015/0108612 | A1 | 4/2015 | Numaguchi |

FOREIGN PATENT DOCUMENTS

| | | | |
|---|---|---|---|
| JP | 2001-203182 | A | 7/2001 |
| JP | 2003-071332 | A | 3/2003 |
| JP | 2004-082038 | A | 3/2004 |
| JP | 2005-142290 | A | 6/2005 |
| JP | 2006-032432 | A | 2/2006 |
| JP | 2006-255665 | A | 9/2006 |
| JP | 2007-335659 | A | 12/2007 |
| JP | 2008-028325 | A | 2/2008 |
| JP | 2011-023618 | A | 2/2011 |
| JP | 2011-205015 | A | 10/2011 |
| JP | 2012-015293 | A | 1/2012 |
| JP | 2012-074589 | A | 4/2012 |
| JP | 2014-053549 | A | 3/2014 |
| WO | 2009/141740 | A2 | 11/2009 |

OTHER PUBLICATIONS

The first Office Action issued by the Chinese Patent Office dated Jun. 28, 2017, which corresponds to Chinese Patent Application No. 201510276407.1 and is related to U.S. Appl. No. 14/614,990; with English language partial translation.

An Office Action issued by the German Patent and Trademark Office dated Aug. 30, 2018, which corresponds to German Patent Application No. 10 2015 209 444.8 and is related to U.S. Appl. No. 15/895,164; with English language translation.

An Office Action issued by the Chinese Patent Office (SIPO) dated Jul. 6, 2018, which corresponds to Chinese Patent Application No. 201510276407.1 and is related to U.S. Appl. No. 15/895,164; with English language translation.

An Office Action issued by the Chinese Patent Office dated Mar. 27, 2018, which corresponds to Chinese Patent Application No. 201510276407.1 and is related to U.S. Appl. No. 15/895,164; with English translation.

* cited by examiner

RESIST REMOVING APPARATUS AND METHOD FOR REMOVING RESIST

CROSS REFERENCE TO RELATED APPLICATIONS

This application is a Divisional Application of U.S. patent application Ser. No. 14/614,990, filed on Feb. 5, 2015, which claims priority to and the benefit of Japanese Patent Application No. 2014-107763, filed on May 26, 2014, the entire contents of which all are incorporated herein by reference.

BACKGROUND OF THE INVENTION

Field of the Invention

The present invention relates to an apparatus for removing a resist of a semiconductor wafer and a method for removing the resist.

Description of the Background Art

In the conventional resist removing apparatus that removes a resist formed on a surface of a semiconductor wafer with a nozzle for supplying an ozone solution such as ozone water, the nozzle is structured to have a supply surface having a shape wider than the surface of the semiconductor wafer to reliably cover the entire surface of the semiconductor wafer, and a distance between the supply surface of the nozzle and the surface of the semiconductor wafer can be adjusted within a range of 1.0 mm or less.

The nozzle in the conventional resist removing apparatus has the above-mentioned structure to improve a removal rate and uniformity upon removal of a resist, to thereby sufficiently remove the resist.

Meanwhile, a semiconductor wafer (hereinafter abbreviated as a "sectional recession wafer") having a sectional recession structure in which the semiconductor wafer is hollowed out to leave a few millimeters of a peripheral portion and only the inside thereof is polished has been recently developed. The sectional recession wafer has a structure having a main portion that is a recessed portion being polished and a protruding peripheral portion that protrudes along the periphery of the main portion at a position higher than the surface of the main portion. The sectional recession wafer having such structure is disclosed as a "wafer manufactured in a TAIKO (trademark) process" in Japanese Patent Application Laid-Open No. 2007-335659.

The main portion of such sectional recession wafer is substantially the wafer portion, so that a resist is formed on the surface of the main portion. Therefore, in a case where the conventional resist removing apparatus is used to remove the resist formed on the surface of the main portion of the sectional recession wafer inside the protruding peripheral portion, the protruding peripheral portion (height of approximately 0.725 mm) makes it substantially impossible to adjust the distance between the surface of the main portion and the supply surface of the nozzle within the range of 1.0 mm or less. The reason is that the distance between the surface of the main portion and the supply surface inevitably exceeds 1.0 mm because the supply surface of the nozzle is needed to be disposed above the protruding peripheral portion (approximately 0.5 mm above) of the sectional recession wafer without reliably coming in contact with the protruding peripheral portion.

Consequently, the distance between the surface of the main portion of the sectional recession wafer and the supply surface of the nozzle inevitably exceeds 1.0 mm in the conventional resist removing apparatus, resulting in a decrease in the removal rate and in-plane uniformity upon the removal of the resist formed on the surface of the main portion of the sectional recession wafer. This leads to the problem that the resist cannot be sufficiently removed.

SUMMARY OF THE INVENTION

It is an object of the present invention to provide a resist removing apparatus and a method for removing the resist that can improve a removal rate and an in-plane uniformity upon removal of a resist formed on a surface of a main portion of a sectional recession wafer and can sufficiently remove the resist.

A resist removing apparatus of the present invention is a resist removing apparatus for a wafer having a main portion and a protruding peripheral portion that is formed along a periphery of the main portion and protrudes at a position higher than a surface of the main portion, in which a resist is formed on the surface of the main portion. The resist removing apparatus includes a nozzle having, as a bottom, a supply surface provided with a supply opening for an ozone solution in the center of the supply surface, and the nozzle has a supply portion structure including the supply surface formed to face the surface of the main portion in a non-contact state without coming in contact with the protruding peripheral portion in a wafer inner space formed between the protruding peripheral portion and the surface of the main portion.

The resist removing apparatus of the present invention has the characteristic above, so that the supply surface can be disposed in the close distance of less than or equal to 1.0 mm, for example, to face the surface of the main portion of the wafer having the protruding peripheral portion. Thus, when the ozone solution is supplied from the supply opening to remove the resist from the surface of the main portion, the removal rate and the uniformity upon the removal of the resist can be improved.

A method for removing a resist of the present invention is a method for removing a resist from a wafer having a main portion and a protruding peripheral portion that is formed along a periphery of the main portion and protrudes at a position higher than a surface of the main portion, in which a resist is formed on the surface of the main portion. The method for removing a resist includes steps (a) to (c) below. The step (a) prepares a nozzle having a supply surface provided with a supply opening for an ozone solution in the center of the supply surface. The nozzle has a supply portion structure including the supply surface formed to face the surface of the main portion in a non-contact state without coming in contact with the protruding peripheral portion in a wafer inner space formed between the protruding peripheral portion and the surface of the main portion. The step (b) disposes the supply portion structure over the surface of the main portion such that a distance between the supply surface and the surface of the main portion is less than or equal to 1.0 mm in the wafer inner space. The step (c) supplies the ozone solution from the supply opening to remove the resist from the surface of the main portion.

The method for removing a resist of the present invention includes the step (b) of disposing the supply surface in the close distance of less than or equal to 1.0 mm from the surface of the main portion of the wafer having the protruding peripheral portion and the step (c) of removing the resist from the surface of the main portion, so that the removal rate and the uniformity of the resist can be improved at the time of performing the step (c).

These and other objects, features, aspects and advantages of the present invention will become more apparent from the following detailed description of the present invention when taken in conjunction with the accompanying drawings.

DESCRIPTION OF THE PREFERRED EMBODIMENTS

Underlying Technology

Figure 3:
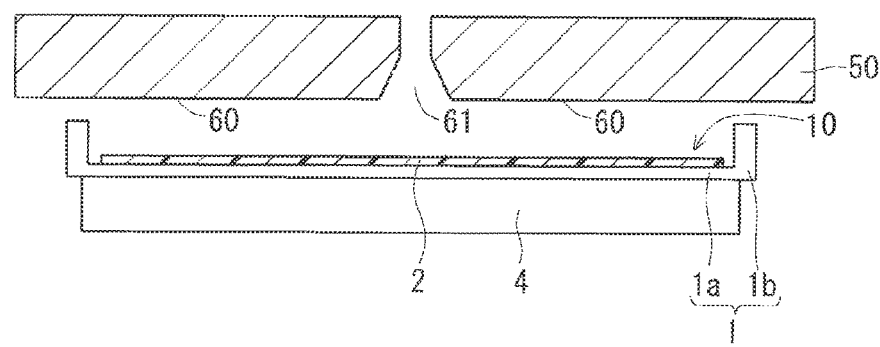
FIG. 3 is a cross-sectional view showing a structure of a conventional resist removing apparatus.

FIG. 3 is a cross-sectional view showing a structure of a conventional resist removing apparatus that removes a resist formed on a surface of a semiconductor wafer with a nozzle for supplying ozone water.

As shown in the diagram, the conventional resist removing apparatus includes a nozzle 50 that supplies the ozone water being one of ozone solutions from a supply opening 61 provided in the center of the nozzle 50. Meanwhile, a sectional recession wafer 1 that is a semiconductor wafer having the resist to be removed is formed of a wafer main portion 1a and a wafer peripheral portion 1b (protruding peripheral portion), the wafer main portion 1a being a recessed portion inside, the wafer peripheral portion 1b being formed along a periphery of the wafer main portion 1a and provided to protrude at a position higher than a surface of the wafer main portion 1a. The sectional recession wafer 1 is disposed on an adsorption stage 4.

The entire sectional recession wafer 1 (wafer main portion 1a+wafer peripheral portion 1b) is formed to be circular having a diameter of 200 mm in plan view. The wafer main portion 1a is formed to be circular having a diameter of 194 to 195 mm in plan view. The wafer main portion 1a is set to have a thickness of 0.04 to 0.05 mm. The wafer peripheral portion 1b is set to have a formation height of 0.725 mm.

Meanwhile, the nozzle 50 in the conventional resist removing apparatus has a structure including a supply surface 60 having a shape greater than the surface of the sectional recession wafer 1 (wafer main portion 1a+wafer peripheral portion 1b) to reliably cover the entire surface of the sectional recession wafer 1 similarly to the case of the general semiconductor wafer.

The wafer main portion 1a of the sectional recession wafer 1 is substantially the wafer portion, so that a resist 2 is selectively formed on the surface of the wafer main portion 1a. The wafer peripheral portion 1b is formed to protrude at the position higher than the surface of the wafer main portion 1a, so that a wafer inner space 10 is provided between the wafer peripheral portion 1b and the surface of the wafer main portion 1a.

In a case where the conventional resist removing apparatus shown in FIG. 3 is used to remove the resist 2 formed on the surface of the wafer main portion 1a of the sectional recession wafer 1, the wafer peripheral portion 1b makes it substantially impossible to adjust the distance between the surface of the wafer main portion 1a and the supply surface 60 of the nozzle 50 within the range of 1.0 mm or less. The reason is that the supply surface 60 cannot be disposed in the wafer inner space 10 and thus the distance between the surface of the wafer main portion 1a and the supply surface 60 inevitably exceeds 1.0 mm because the supply surface 60 of the nozzle 50 is needed to be disposed above the wafer peripheral portion 1b (approximately 0.5 mm above) of the sectional recession wafer 1 without coming in contact with the wafer peripheral portion 1b as described above.

First Preferred Embodiment

Figure 1:
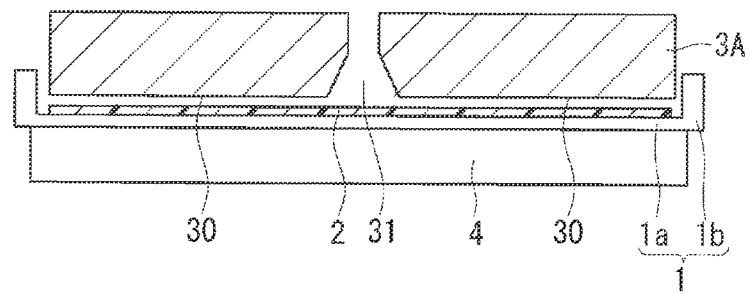
FIG. 1 is a cross-sectional view showing a structure of a nozzle of a resist removing apparatus according to a first preferred embodiment of the present invention.

FIG. 1 is a cross-sectional view showing a structure of a nozzle of a resist removing apparatus according to a first preferred embodiment of the present invention. The resist removing apparatus of the first preferred embodiment includes a nozzle 3A having an optimal structure for removing the resist 2 formed on the surface of the wafer main portion 1a of the sectional recession wafer 1.

The structure of the nozzle 3A will be specifically described below. To supply ozone water being one of ozone solutions, the nozzle 3A has a tapered structure in cross section in the center thereof that expands outwardly from the center down from the middle, and the nozzle 3A also has, as the bottom, a supply surface 30 provided with a supply opening 31 that is circular in plan view.

The nozzle 3A as a whole is formed into the substantially cylindrical structure having the supply surface 30 with the supply opening 31 as the bottom surface. The supply surface 30 is slightly narrower than the surface of the wafer main portion 1a and also has a shape that fits in the surface of the wafer main portion 1a. Specifically, the wafer main portion 1a of the sectional recession wafer 1 is formed into a circular shape with a surface shape having a diameter of 194 to 195 mm while a surface shape of the supply surface 30 with the supply opening 31 is formed into a circular shape having a diameter of approximately 190 mm.

Therefore, in a state where the center of the wafer main portion 1a and the center of the supply surface 30 coincide with each other in plan view, the nozzle 3A is brought close to the surface (region for forming the resist 2) of the wafer main portion 1a, whereby the supply surface 30 can be disposed in the wafer inner space 10. In other words, while the gap of approximately 2.0 mm is secured between the nozzle 3A and the inner surface of the wafer peripheral portion 1b, the supply surface 30 of the nozzle 3A can be disposed in a close distance of less than or equal to 1.0 mm from the surface of the wafer main portion 1a in the wafer inner space 10.

In this manner, the nozzle 3A in the resist removing apparatus of the first preferred embodiment is characterized to have, as an overall structure, a supply portion structure including the supply surface 30 that is formed to face the surface of the wafer main portion 1a in the close distance in a non-contact state.

A description is given next of a method for removing a resist that is a method for removing the resist 2 formed on the surface of the wafer main portion 1a of the sectional recession wafer 1 with the resist removing apparatus of the first preferred embodiment shown in FIG. 1. Hereinafter, the resist 2 is a thin film at a negligible level (μm order) compared to 1.0 mm, and thus the description is given while neglecting the thickness of the resist 2 for the sake of description.

First, in a step (a), the nozzle 3A having the supply surface 30 provided with the supply opening 31 for ozone water in the center of the supply surface 30 is prepared. As described above, the nozzle 3A has the supply portion structure in which the supply surface 30 is formed in the wafer inner space 10 to face the surface of the wafer main portion 1a in the close distance in the non-contact state without coming in contact with the wafer peripheral portion 1b.

Next, in a step (b), while the center of the supply surface 30 and the center of the wafer main portion 1a coincide with each other in plan view, the supply surface 30 is closely disposed over the surface of the wafer main portion 1a (see FIG. 1) such that the distance between the supply surface 30 and the surface of the wafer main portion 1a is less than or equal to 1.0 mm in the wafer inner space 10 (see FIG. 3). At this time, the gap of approximately 2.0 mm between the (side) inner surface of the wafer peripheral portion 1b and the (side) outer surface of the nozzle 3A can be secured, so that the non-contact state between the nozzle 3A and the wafer peripheral portion 1b can be maintained with stability. In addition, it is preferable that the gap between the inner surface of the wafer peripheral portion 1b and the outer surface of the nozzle 3A is at least approximately 1.0 mm.

Then, in a step (c), the ozone water is supplied from the supply opening 31 to remove the resist 2 from the surface of the wafer main portion 1a. At this time, the supply surface 30 of the nozzle 3A can be disposed over the substantially entire surface of the wafer main portion 1a. For example, in a case where the wafer main portion 1a has a diameter of 194 mm and the supply surface 30 has a diameter of 190 mm, the supply surface 30 can be disposed to face the region of approximately 96% of the surface of the wafer main portion 1a.

In this manner, the method for removing the resist from the sectional recession wafer 1 with the resist removing apparatus of the first preferred embodiment includes the step (b) of disposing the supply surface 30 in the close distance of less than or equal to 1.0 mm from the surface of the wafer main portion 1a and the step (c) of removing the resist 2 from the surface of the wafer main portion 1a with the ozone water. Therefore, a removal rate and in-plane uniformity (the resist 2 can be uniformly removed) can be improved upon the removal of the resist 2 by performing the step (c).

Consequently, the method for removing the resist with the resist removing apparatus of the first preferred embodiment can sufficiently remove the resist 2 formed on the surface of the wafer main portion 1a, allowing for improvements in yields and extended lifetime of a semiconductor device formed on the sectional recession wafer 1.

To achieve the effects, the nozzle 3A preferably has a shape in which the supply surface 30 covers the region of at least 90% of the wafer main portion 1a to supply the resist 2 with the ozone water from the supply opening 31 almost uniformly. In other words, if the supply surface 30 has the nozzle shape that is too small for the wafer main portion 1a, it is substantially difficult to achieve the effects.

Moreover, the nozzle 3A used in the resist removing apparatus of the first preferred embodiment is formed as a whole into the columnar structure having the supply surface 30 as the bottom surface, so that a relatively simple structure can dispose the supply surface 30 in the close distance from the surface of the wafer main portion 1a of the sectional recession wafer 1.

Second Preferred Embodiment

Figure 2:
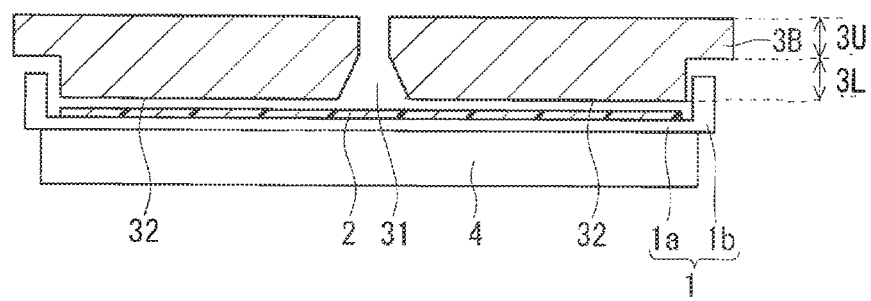
FIG. 2 is a cross-sectional view showing a structure of a nozzle of a resist removing apparatus according to a second preferred embodiment of the present invention.

FIG. 2 is a cross-sectional view showing a structure of a nozzle of a resist removing apparatus according to a second preferred embodiment of the present invention. The resist removing apparatus of the second preferred embodiment includes a nozzle 3B having an optimal structure for removing the resist 2 formed on the surface of the wafer main portion 1a of the sectional recession wafer 1.

The structure of the nozzle 3B will be specifically described below. The nozzle 3B has, as the bottom, a supply surface 32 provided with the supply opening 31 for the ozone water in the center of the supply surface 32.

The nozzle 3B has a lower portion 3L formed in a cylindrical structure that has the supply surface 32 with the supply opening 31 as the bottom surface similarly to the nozzle 3A. The supply surface 32 similar to the supply surface 30 of the first preferred embodiment is narrower than the surface of the wafer main portion 1a and also has a shape that fits in the surface of the wafer main portion 1a. On the other hand, an upper portion 3U of the nozzle 3B is formed into a planar shape that is greater than the planar shape of the entire sectional recession wafer 1 (wafer main portion 1a+wafer peripheral portion 1b). Therefore, as shown in FIG. 2, the nozzle 3B has a cross-sectional shape having a step in which the upper portion 3U protrudes more outward than the lower portion 3L.

Consequently, in the resist removing apparatus of the second preferred embodiment similar to the resist removing apparatus of the first preferred embodiment, the nozzle 3B is brought close to the surface (region for forming the resist 2) of the wafer main portion 1a in a state where the center of the wafer main portion 1a and the center of the supply surface 32 coincide with each other in plan view, so that the supply surface 32 can be closely disposed in the wafer inner space 10.

Even in a state where the supply surface 32 is brought closest to the surface of the wafer main portion 1a, the height of the lower portion 3L of the nozzle 3B is set such that the bottom surface of the upper portion 3U of the nozzle 3B does not come in contact with the tip portion of the wafer peripheral portion 1b. For example, in a case where the nozzle 3B has a thickness of approximately 10 mm, the upper portion 3U and the lower portion 3L are each formed with a thickness of approximately 5 mm.

In this manner, the nozzle 3B in the resist removing apparatus of the second preferred embodiment is characterized to have the lower portion 3L having a supply portion structure including the supply surface 32 that is formed to face the surface of the wafer main portion 1a in a non-contact state.

A method for removing a resist with the resist removing apparatus of the second preferred embodiment shown in FIG. 2 performs the steps (a) to (c) similarly to the method for removing a resist of the first preferred embodiment. In other words, the method is performed similarly to that in the first preferred embodiment except for that the supply portion structure (entire nozzle 3A) having the supply surface 30 is substituted by the supply portion structure (lower portion 3L of the nozzle 3B) having the supply surface 32.

In this manner, the nozzle 3B used in the resist removing apparatus of the second preferred embodiment has the lower portion 3L formed in the columnar structure having the supply surface 32 as the bottom surface, so that a relatively simple structure can also dispose the supply surface 32 in the close distance from the wafer main portion 1a of the sectional recession wafer 1 while the structure of the upper portion 3U is set arbitrarily.

As a result, the resist removing apparatus of the second preferred embodiment can improve the removal rate and the in-plane uniformity upon the removal of the resist 2 similarly to the first preferred embodiment.

Comparing the first preferred embodiment and the second preferred embodiment, the nozzle 3A of the first preferred embodiment has the more simple structure and does not suffer damage due to a secular variation unlike the peripheral region of the upper portion 3U above the wafer peripheral portion 1b in the second embodiment.

Modifications

In general, a material for the nozzle 3A in the resist removing apparatus of the first preferred embodiment and the nozzle 3B in the resist removing apparatus of the second preferred embodiment is conceivably a resin, a quartz, or the like.

However, in the first and second preferred embodiments, to consider that the supply surface 30 and the supply surface 32 of the nozzle 3A and the nozzle 3B, respectively, are closely disposed over the surface for forming the resist 2 on the surface of the wafer main portion 1a with high accuracy, it is preferable to adopt the modification that uses titanium as the material for the nozzle 3A and the nozzle 3B.

As described above, the modification of the first and second preferred embodiments uses the titanium as the constituent material for the nozzle 3A and the nozzle 3B, and thus resistance to the ozone water (resistance to ozone solution) can be improved upon removal of a resist and the distance between the nozzle 3A (3B) and the wafer main portion 1a can be accurately controlled when the supply surface 30 (32) of the nozzle 3A (3B) is disposed in the close distance from the surface of the wafer main portion 1a.

This point will be described below in detail. In a case where the material other than the titanium, for example, the resin is used as the constituent material for the nozzle 3A and the 3B, it is concerned that the supply surface 30 (32) is etched by the ozone water (ozone solution) upon the removal of the resist 2 and is oxidized, to thereby fail to maintain the uniform surface shape, resulting in deformation or deterioration. However, the modification that uses the titanium having high resistance to the ozone water as the constituent material for the nozzle 3A (3B) is adopted to eliminate the concerns to improve the resistance to the ozone water. In addition, the effect of resistance to the ozone water is also expected in a case where the quartz is used as the constituent material for the nozzle 3A.

Furthermore, in a case where the titanium is used as the constituent material for the nozzle 3A and the nozzle 3B, the distance (proximity distance) between the supply surface 30 (32) of the nozzle 3A (3B) and the surface of the wafer main portion 1a can be accurately measured because the titanium has light transmitting properties superior to the quartz or the like. As a result, the proximity distance is measured all the time to control to accurately maintain the proximity distance at a constant value based on the measurement result, thereby achieving the effect of accurately controlling the proximity distance.

In addition, according to the present invention, the above preferred embodiments can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for removing a resist from a wafer having a main portion and a protruding peripheral portion that is formed along a periphery of said main portion and that protrudes at a position higher than a surface of said main portion, said main portion and said protruding peripheral portion defining a wafer inner space of the wafer, in which a resist is formed on the surface of said main portion, said method for removing a resist comprising the steps of:
(a) preparing a nozzle having a supply surface provided with a supply opening for an ozone solution in the center of said supply surface, said nozzle having a supply portion structure including said supply surface formed to be inserted into said wafer inner space and face the surface of said main portion in a non-contact state without coming in contact with said protruding peripheral portion,
(b) disposing said supply portion structure such that said supply surface is within said wafer inner space and over the surface of said main portion, and a distance between said supply surface and the surface of said main portion is less than or equal to 1.0 mm in said wafer inner space; and
(c) supplying the ozone solution from said supply opening to remove said resist from the surface of said main portion.

* * * * *